US006110774A

United States Patent [19]
Jost et al.

[11] Patent Number: 6,110,774
[45] Date of Patent: *Aug. 29, 2000

[54] METHOD OF FORMING A BIT LINE OVER CAPACITOR ARRAY OF MEMORY CELLS AND AN ARRAY OF BIT LINE OVER CAPACITOR ARRAY OF MEMORY CELLS

[75] Inventors: Mark Jost, Boise; Charles Dennison, Meridian, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/920,621

[22] Filed: Aug. 27, 1997

Related U.S. Application Data

[63] Continuation of application No. 08/712,616, Sep. 13, 1996, Pat. No. 5,702,990, which is a continuation of application No. 08/394,546, Feb. 22, 1995, Pat. No. 5,605,857, which is a continuation-in-part of application No. 08/277,916, Jul. 20, 1994, Pat. No. 5,401,681, which is a continuation-in-part of application No. 08/047,668, Apr. 14, 1993, Pat. No. 5,338,700, and a continuation-in-part of application No. 08/017,067, Feb. 12, 1993, Pat. No. 5,340,763.

[51] Int. Cl.[7] ............................................. H01L 21/8242
[52] U.S. Cl. ........................................... 438/253; 438/397
[58] Field of Search .................................... 438/253, 396, 438/254, 397, 256, 399, 637, 738

[56] References Cited

U.S. PATENT DOCUMENTS

| | | | |
|---|---|---|---|
| 4,954,927 | 9/1990 | Park | 257/296 |
| 5,030,587 | 7/1991 | Wald et al. | 437/228 PL |
| 5,118,640 | 6/1992 | Fujii et al. . | |
| 5,126,916 | 6/1992 | Tseng | 361/313 |
| 5,134,086 | 7/1992 | Ahn . | |
| 5,155,056 | 10/1992 | Jeong-Gyoo . | |

(List continued on next page.)

FOREIGN PATENT DOCUMENTS

| | | | |
|---|---|---|---|
| 263-941 | 8/1987 | European Pat. Off. | 257/306 |
| 0-439-965-A2 | 12/1990 | European Pat. Off. . | |
| 0-439-965-A3 | 12/1990 | European Pat. Off. . | |
| 63-281457 | 11/1988 | Japan | 257/306 |
| 64-41262 | 5/1989 | Japan . | |
| 02260454 | 1/1991 | Japan . | |
| 3-38061 | 4/1991 | Japan . | |
| 3-76159 | 4/1991 | Japan . | |
| 3-82155 | 4/1991 | Japan . | |
| 4-045571 | 2/1992 | Japan | 257/306 |
| 4-99375 | 3/1992 | Japan . | |

OTHER PUBLICATIONS

Ahn, J.H., et al., "Micro Villus Patterning (MVP) Technology for 256Mb Dram Stack Cell", 1992 Symposium on VLSI Technology Digest of Technical Papers, pp. 12–13.

*Primary Examiner*—Tuan H. Nguyen
*Attorney, Agent, or Firm*—Wells, St. John, Roberts, Gregory & Matkin, P.S.

[57] ABSTRACT

A semiconductor memory device includes, a) a semiconductor substrate; b) a field effect transistor gate positioned outwardly of the semiconductor substrate; c) opposing active areas formed within the semiconductor substrate on opposing sides of the gate; d) a capacitor electrically connected with one of the active areas; the capacitor comprising an inner storage node, a capacitor dielectric layer, and an outer cell node; the inner storage node electrically connecting with the one active area, the inner storage node having an upper surface at an elevation; e) a bit line; f) a dielectric insulating layer positioned intermediate the bit line and the other active area; and g) an electrically conductive bit line plug extending through the insulating layer to contact with the other active area and electrically interconnect the bit line with the other active area, the bit line plug being homogeneous in composition between the other active area and the elevation of the inner storage node upper surface. A method of producing such a construction is also disclosed.

3 Claims, 5 Drawing Sheets

U.S. PATENT DOCUMENTS

| | | | |
|---|---|---|---|
| 5,206,183 | 4/1993 | Dennison | 437/47 |
| 5,227,322 | 7/1993 | Ko et al. | 437/60 |
| 5,229,314 | 7/1993 | Okudaira et al. | |
| 5,266,514 | 11/1993 | Tuan et al. | |
| 5,292,677 | 3/1994 | Dennison | 437/52 |
| 5,338,700 | 8/1994 | Dennison et al. | 437/60 |
| 5,361,234 | 11/1994 | Iwasa | 365/210 |
| 5,389,568 | 2/1995 | Yun | 438/396 |
| 5,401,681 | 3/1995 | Dennison | 438/396 |
| 5,409,855 | 4/1995 | Jun | 437/60 |
| 5,422,315 | 6/1995 | Kobayashi | 437/228 |
| 5,444,653 | 8/1995 | Nagasawa et al. | 257/296 |
| 5,459,105 | 10/1995 | Matsuura | 437/228 PL |
| 5,488,007 | 1/1996 | Kim et al. | 437/60 |
| 5,565,372 | 10/1996 | Kim | 437/60 |
| 5,843,829 | 12/1998 | Kuramae et al. | 438/396 |

6,110,774

METHOD OF FORMING A BIT LINE OVER CAPACITOR ARRAY OF MEMORY CELLS AND AN ARRAY OF BIT LINE OVER CAPACITOR ARRAY OF MEMORY CELLS

RELATED PATENT DATA

This patent resulted from a continuation of U.S. Pat. application Ser. No. 08/712,616, now U.S. Pat. No. 5,702,990, filed on Sep. 13, 1996, entitled "Method of Forming a Bit Line Over Capacitor Array of Memory Cells and an Array of Bit Line Over Capacitor Array of Memory Cells", listing Mark Jost and Charles H. Dennison as inventors, which is a continuation of U.S. Pat. application Ser. No. 08/394,546, now U.S. Pat. No. 5,605,857, filed on Feb. 22, 1995, entitled "Method of Forming a Bit Line Over Capacitor Array of Memory Cells and an Array of Bit Line Over Capacitor Array of Memory Cells", listing Mark Jost and Charles H. Dennison as inventors; which is a continuation-in-part patent application of U.S. Pat. application Ser. No. 08/277,916, filed on Jul. 20, 1994, entitled "Method Of Forming A Bit Line Over Capacitor Array Of Memory Cells", listing Charles H. Dennison as an inventor, and which is now U.S. Pat. No. 5,401,681; which is a continuation-in-part of Ser. No. 47,668, Apr. 14, 1993, Pat. No. 5,338,700; and a continuation-in-part of Ser. No. 17,067, Feb. 12, 1993, Pat. No. 5,340,763.

TECHNICAL FIELD

This invention relates generally to formation of a bit line over capacitor arrays of memory cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the word lines and bit lines. With non-buried bit line constructions, deep vertical contacts are made through a thick insulating layer to the cell FETs, with the capacitor constructions being provided over the word lines and beneath the bit lines. Such non-buried bit line constructions are also referred to as "capacitor-under-bit line" or "bit line-over-capacitor" constructions, and are the subject of this invention.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
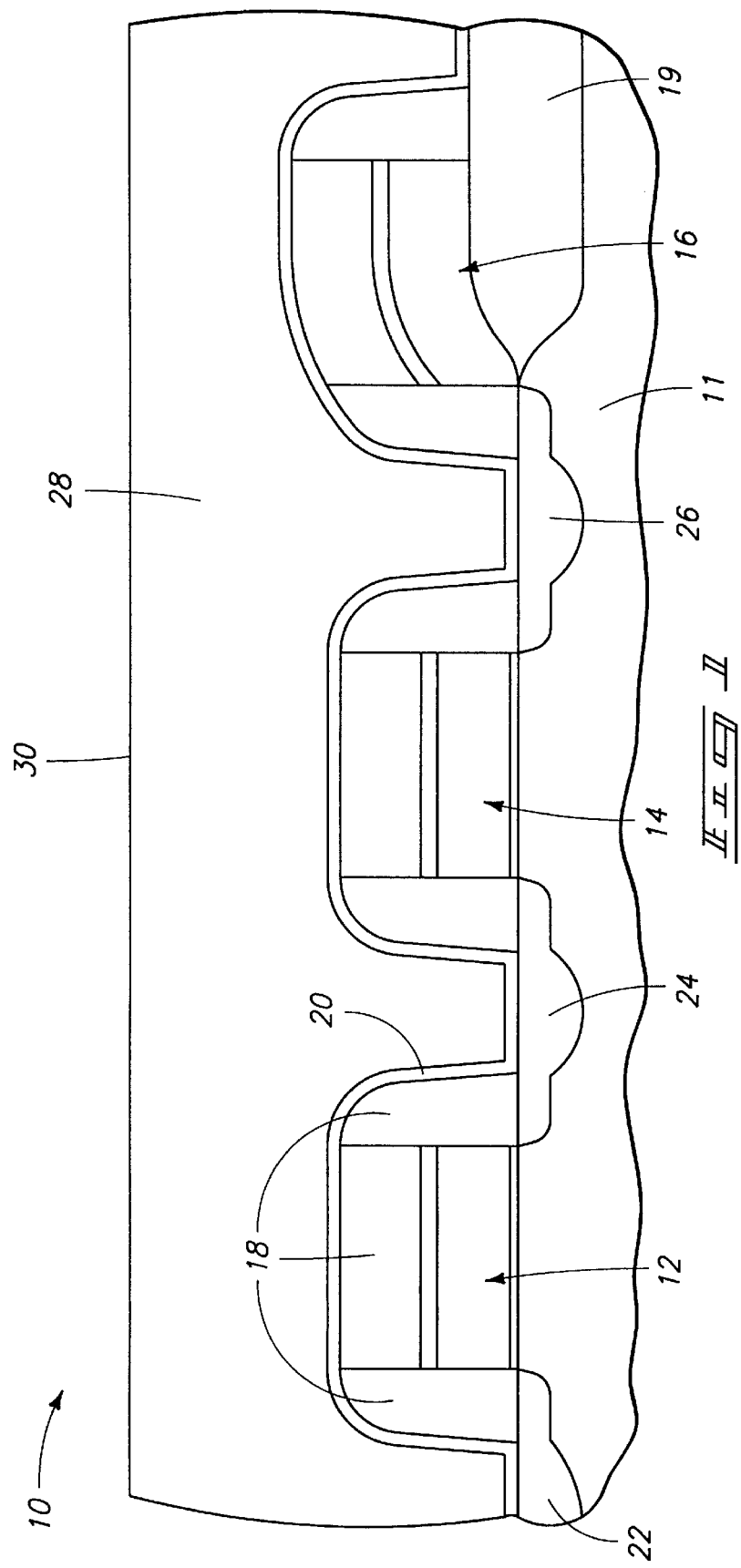
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a bit line over capacitor array of memory cells comprises the following steps:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a layer of electrically insulating material over the word lines and active areas, the layer of insulating material having an uppermost surface which is above the word lines;

providing a second contact opening through the insulating material layer to the second active region;

providing a first electrically conductive layer over the insulating material upper surface and within the second contact opening which electrically connects with the second active region, the first electrically conductive layer being provided to a thickness which completely fills the second contact opening;

providing a first contact opening through the first electrically conductive layer and through the insulating material to the first active region;

providing a capacitor storage node electrically conductive layer over the first electrically conductive layer and within the first contact opening which electrically connects with the first active region, the storage node layer being provided to a thickness which less than completely fills the first contact opening; and chemical-mechanical polishing the capacitor storage node layer and the first conductive layer inwardly to at least the upper surface of the insulating material, the chemical-mechanical polishing step effectively electrically isolating the first conductive layer material within the second contact opening from the storage node conductive layer material within the first contact opening, the chemical-mechanical polishing step effectively defining a homogeneous second contact plug having a plug upper surface, the chemical-mechanical polishing step effectively defining an isolated capacitor storage node having an upper surface, the upper surfaces of the plug and storage node being elevationally coincident.

In accordance with another aspect of the invention, a semiconductor memory device comprises:

a semiconductor substrate;

a field effect transistor gate positioned outwardly of the semiconductor substrate;

opposing active areas formed within the semiconductor substrate on opposing sides of the gate;

a capacitor electrically connected with one of the active areas; the capacitor comprising an inner storage node, a capacitor dielectric layer, and an outer cell node; the inner storage node electrically connecting with the one active area, the inner storage node having an uppermost surface at an elevation;

a bit line;

a dielectric insulating layer positioned intermediate the bit line and the other active area; and an electrically conductive bit line plug extending through the insulating layer to contact with the other active area and electrically interconnect the bit line with the other active area, the bit line plug being homogeneous in composition between the other active area and the elevation of the inner storage node upper surface.

These and other aspects of the invention will be appreciated from the following description and concluding claims.

Referring first to FIG. 1, a semiconductor wafer fragment is indicated generally by reference numeral 10. Wafer 10 is defined in part by a bulk silicon semiconductive substrate 11, and has been provided with an array of substantially electrically isolated word lines, such as the illustrated word lines 12, 14 and 16. Such word lines are of a conventional construction having a lowermost gate oxide, a lower polysilicon layer, an overlying silicide layer such as tungsten silicide, and insulating caps and side insulating spacers 18. Such spacers and caps 18 preferably comprise an insulative nitride, such as $Si_3N_4$. A thin layer 20 of $Si_3N_4$ is provided atop the wafer to function as a diffusion barrier. Layer 20 has a thickness which is preferably from about 100 Angstroms to about 250 Angstroms.

Active areas are provided about the word lines, such as active regions 22, 24 and 26, to define an array of memory cell FETs. The discussion proceeds with reference to a FET formed using word line 14, which would be provided with a capacitor construction for definition of a single memory cell. Active region 26 defines a first active region for electrical connection with a memory cell capacitor (described below). Active region 24 defines a second active region for electrical connection with a bit line (described below). Field oxide 19 is provided, as shown.

A planarized first insulating material layer 28 is provided over the word lines and active areas. An example material is borophosphosilicate glass (BPSG). An example deposition thickness is between 6,000 and 9,000 Angstroms, with subsequent planarization by chemical-mechanical polishing (CMP) to an elevation of from about 2,000 Angstroms to about 4,000 Angstroms above the word line nitride caps 18 which are positioned adjacent the active areas, as opposed to the word lines which are over the field oxide. Such provides a planarized upper surface 30 which is elevationally above the word lines.

Figure 2:
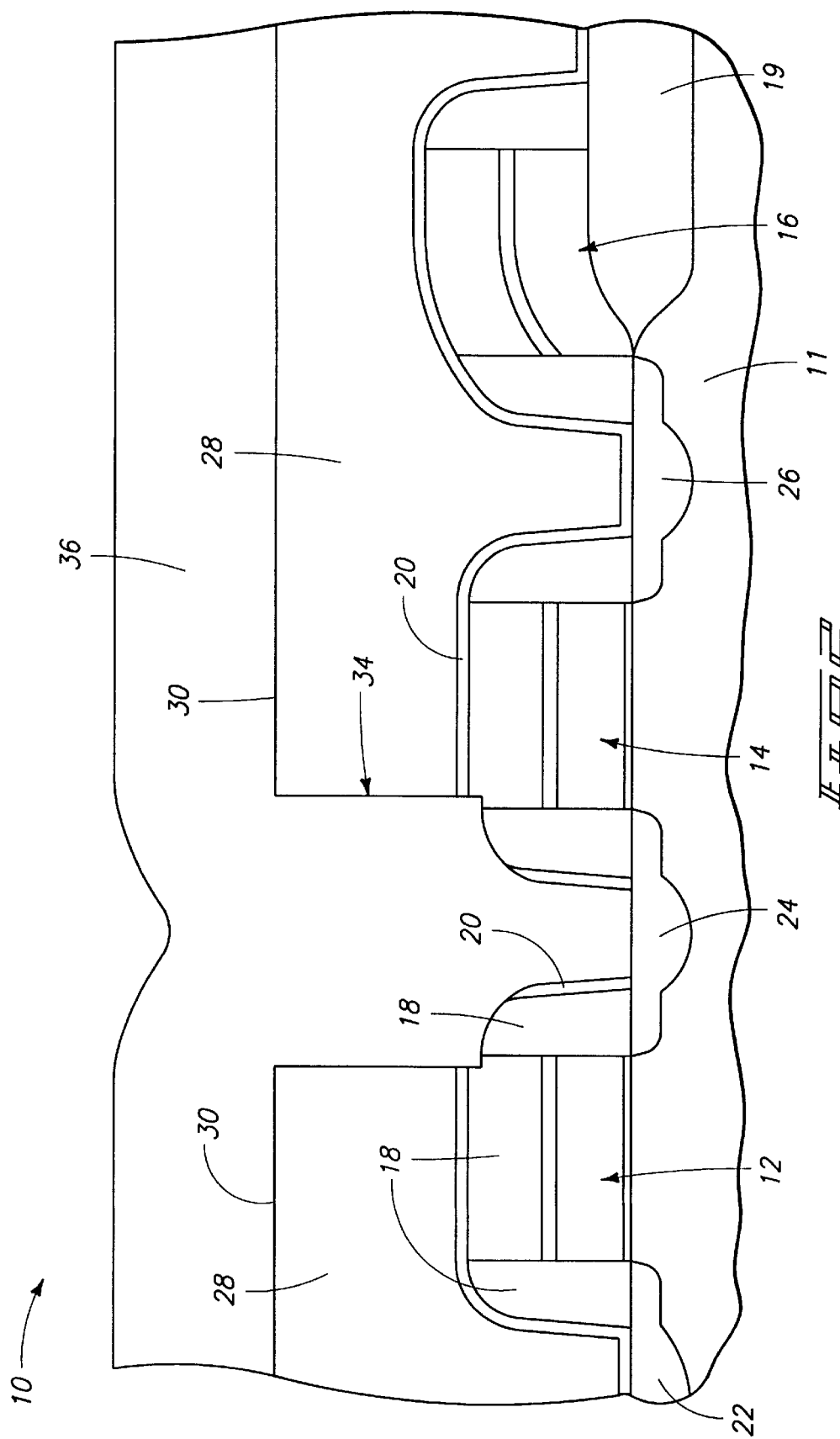
FIG. 2 is a view of the FIG. 1 wafer taken at a step subsequent to that shown by FIG. 1.

Referring to FIG. 2, a series of contact openings 34 (only one being shown, and referred to as a second contact opening for purposes of the continuing discussion) is provided through insulating material layer 28 inwardly to outwardly expose second active region 24. Such would typically be formed by photomasking and dry chemical etching of BPSG selectively relative to nitride. An example etch chemistry would include $CHF_3$ and $O_2$ at low $O_2$ flow rate (i.e., less than 5% $O_2$ by volume in a $CHF_3/O_2$ mixture), or the combination of $CF_4$, Ar, $CH_2F_2$ and $CHF_3$. Thereafter, etches of the wafer are conducted to etch nitride layer 20 selectively relative to underlying silicon substrate 11 to upwardly expose active region 24. An example etch chemistry would include a combination of $CHF_3$ and $CF_4$. The principal purpose of barrier layer 20 is to prevent diffusion of boron or phosphorus atoms from BPSG layer 28 into active areas 24 and 26. Caps 18 are preferably comprised of nitride ($Si_3N_4$) and layer 28 comprised of oxide, such that the contact etch to produce first contact 34 will stop relative to word line spacers and caps 18.

Subsequently, a first electrically conductive layer 36 is provided over insulating material layer 28, upper surface 30 and within second contact opening 34 to electrically connect with second active region 24. Conductive layer 36 is deposited to a thickness sufficient to completely fill second contact opening 34, as shown. An example preferred composition is conductively doped polysilicon.

Figure 3:
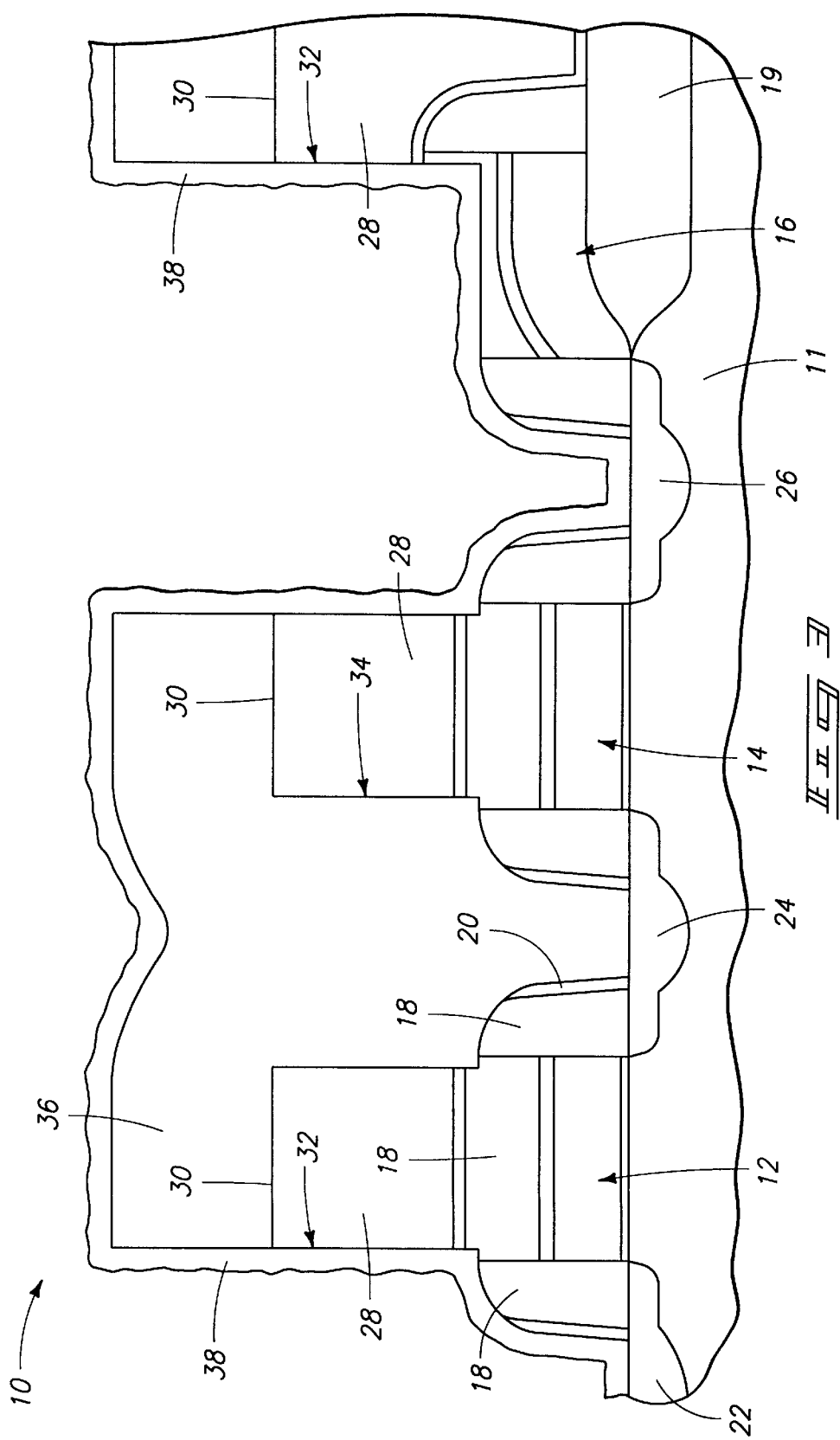
FIG. 3 is a view of the FIG. 1 wafer taken at a step subsequent to that shown by FIG. 2.

Referring to FIG. 3, a series of first contact openings 32 is provided through electrically conductive layer 36 and insulating material layer 28 inwardly to outwardly expose first active region 26. Subsequently, a capacitor storage node electrically conductive layer 38 is provided over first electrically conductive layer 36 and within first contact opening 32 to electrically connect with first active region 26. Layer 38 is deposited to a thickness which less than completely fills first contact opening 32. An example diameter for first contact opening 32 is 0.5 micron by 0.8 micron, while an example diameter for second contact opening 34 is 0.5 micron. In such instance, an example preferred thickness for layer 36 is 4000 Angstroms. An example and preferred material for layer 38 is hemispherical grain (HSG) polysilicon. Such can be provided by first depositing a 600 Angstroms thick in situ doped polysilicon layer, followed by deposition of undoped HSG poly. Subsequent heating inherent in wafer processing will effectively conductively dope the overlying HSG poly layer. Alternately, layer 38 can be provided by in situ arsenic doping of an entire HSG layer. Layer 38 is provided to physically contact active area 26 without there being any intervening conductive layer.

Figure 4:
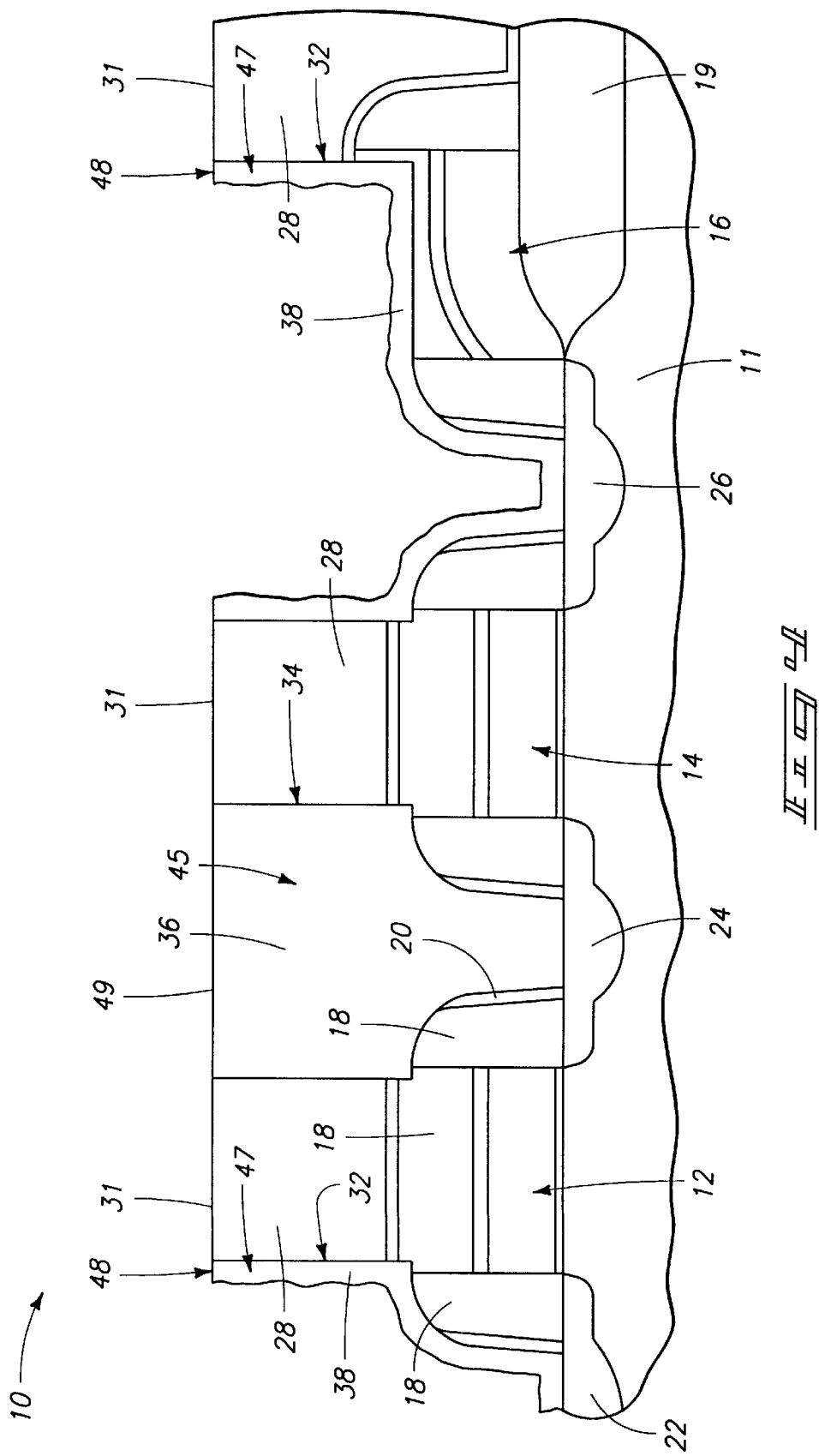
FIG. 4 is a view of the FIG. 1 wafer taken at a step subsequent to that shown by FIG. 3.

Referring to FIG. 4, capacitor storage node layer 38 and first conductive layer 36 are chemically mechanically polished inwardly to at least upper surface 30 (not shown in FIG. 4) of insulating material layer 28. In the illustrated and preferred embodiment, such chemical-mechanical polishing removes first conductive layer 36 and capacitor storage node layer 38 downwardly to below former upper surface 30 of insulating material 28, which is newly designated with numeral 31. In the illustrated embodiment, such polishing is conducted to remove such materials to downwardly below the former upper surface of insulating material, which is now designated with numeral 31. Preferably, the chemical-mechanical polishing is conducted in a single step. An example and preferred chemical-mechanical polishing step to achieve the FIG. 4 construction includes using slurry SC25 from Rodel Products Corporation of Newark, Del., diluted with $H_2O$ and KOH. SC25 consists primarily of $H_2O$, silica ($SiO_2$ particles), and KOH. It is diluted approximately 1:1 with $H_2O$ and additional KOH can be injected at the point of use to increase the pH and adjust the oxide to silicon etch rate if desired.

The chemical-mechanical polishing step effectively electrically isolates first conductive layer material 36 within second contact opening 34 from storage node conductive layer material 38 within first contact opening 32. The chemical-mechanical polishing step also effectively defines a homogenous second contact plug 45 having a plug upper surface 49. Also, the chemical-mechanical polishing step effectively defines an isolated capacitor storage node 47 having an upper surface 48, with upper surface 48 of the storage node being elevationally coincident with upper surface 49 of plug 45, and correspondingly with upper surface 31 of insulating material layer 28.

Figure 5:
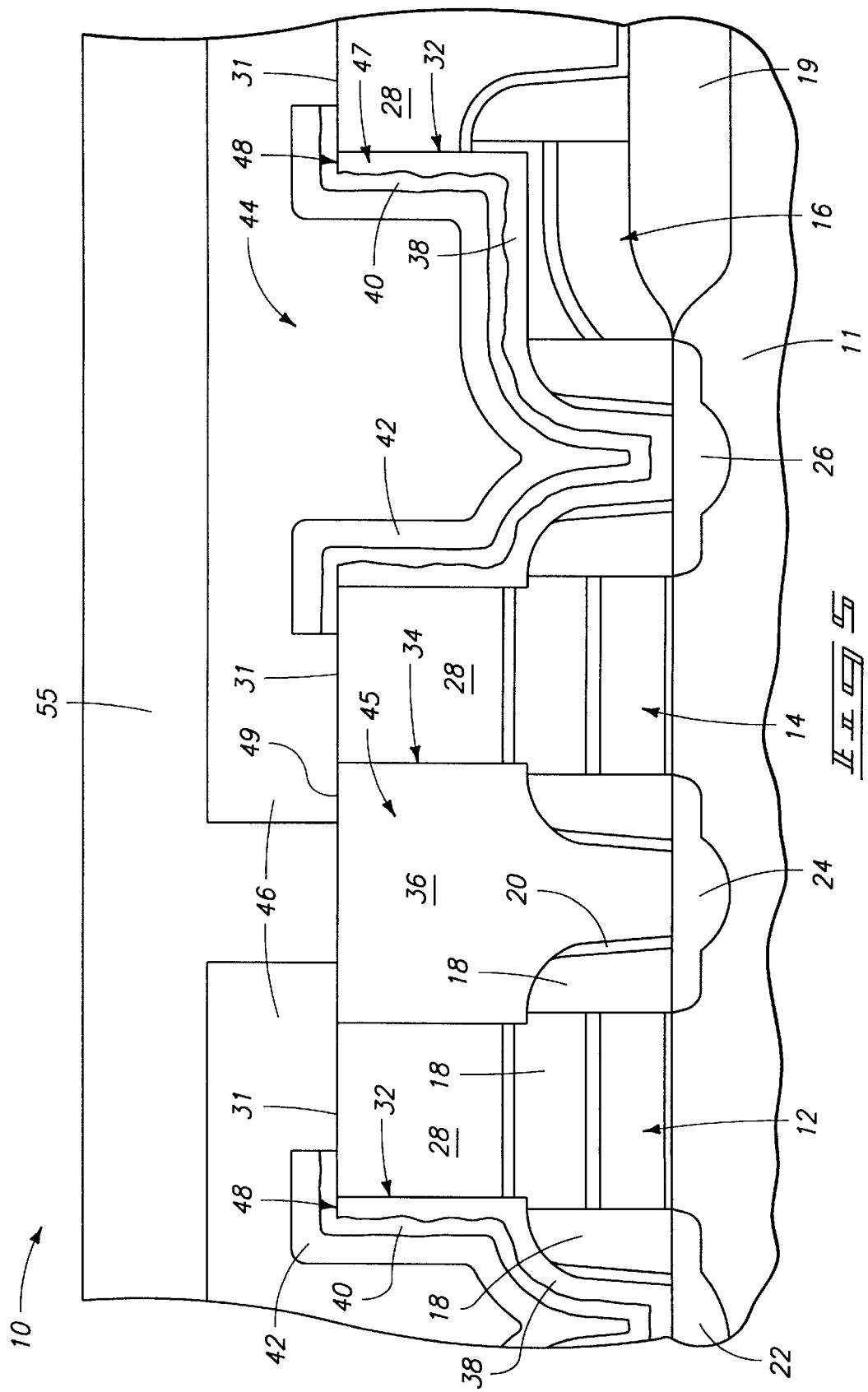
FIG. 5 is a view of the FIG. 1 wafer taken at a step subsequent to that shown by FIG. 4.

Referring to FIG. 5, subsequent processing would be conducted in accordance with that of the parent 08/277,916 disclosure to produce a construction corresponding to that of the parent FIG. 7. Specifically, an ONO cell dielectric layer 40 and overlying outer cell polysilicon layer 42 would be provided as shown to provide a capacitor construction 44. An overlying insulating layer 46 would be provided, followed by subsequent deposition and patterning of a conductive material to form a bit line 55. An homogenous electrically conductive bit line plug is thereby provided between active area 24 and the elevation of planarized surface 31, and therefore the elevation of inner storage node 47 upper surface 48.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a bit line plug to an active region, comprising the following steps:

forming a word line over a semiconductor wafer;

forming a first active region and a second active region associated with the word line;

forming a layer of electrically insulating material over the word line and active regions;

forming a bit line contact opening through the insulating material layer to the second active region;

forming an electrically conductive layer over the insulating material layer and within the bit line contact opening, the electrically conductive layer within the bit line contact opening ultimately forming a bit line plug; and using a single photomasking step, removing portions of the electrically conductive layer and the insulating material to form a capacitor opening to the first active region.

2. A method of forming an array of bit line plugs, comprising the following steps:

forming an array of word lines over a semiconductor wafer;

forming first and second active regions associated with each of the word lines;

forming a layer of electrically insulating material over the word lines and active regions;

forming bit line contact openings through the insulating material layer to the second active regions;

forming an electrically conductive layer over the insulating material layer and within the bit line contact openings, the electrically conductive layer within the bit line contact openings ultimately forming bit line plugs; and using a single photomasking step, removing portions of the electrically conductive layer and the insulating material to form capacitor openings to the first active regions.

3. A method of forming a bit line p lug to an active region, comprising the following steps:

forming a word line over a semiconductor wafer;

forming a first active region and a second active region associated with the word line;

forming a layer of electrically insulating material over the word line and active regions, the layer of electrically insulating material comprising an upper surface at a first level, the layer of electrically insulating material comprising borophosphosilicate glass;

forming a bit line contact opening through the insulating material layer to the second active region;

forming an electrically conductive layer over the insulating material layer and within the bit line contact opening, the electrically conductive layer within the bit line contact opening ultimately forming a bit line plug;

forming a capacitor opening through the electrically conductive layer and through the insulating material to the first active region; and after forming the capacitor opening, chemical-mechanical polishing the electrically conductive layer to below the first level of the upper surface of the layer of the insulating material.

* * * * *

UNITED STATES PATENT AND TRADEMARK OFFICE
CERTIFICATE OF CORRECTION

PATENT NO.   : 6,110,774
DATED        : August 29, 2000
INVENTOR(S)  : Mark Jost; Charles Dennison It is certified that error appears in the above-identified patent and that said Letters Patent are hereby corrected as shown below:

Col. 3, line 46   Replace "mecbanical" with --mechanical--

Col. 3, line 65   Replace "region 24" with --regions 26 and 24--

Col. 4, line 4    Replace "contact 34" with --contacts 32 and 34--

Signed and Sealed this

Fifteenth Day of May, 2001

Attest:

NICHOLAS P. GODICI

Attesting Officer    Acting Director of the United States Patent and Trademark Office